(12) United States Patent
Maeda et al.

(10) Patent No.: US 8,026,185 B2
(45) Date of Patent: Sep. 27, 2011

(54) METHOD FOR MANUFACTURING ELECTRONIC CIRCUIT COMPONENT

(75) Inventors: Shinichi Maeda, Chiba (JP); Go Ono, Chiba (JP); Issei Okada, Osaka (JP); Kohei Shimoda, Osaka (JP)

(73) Assignees: Sumitomo Electric Industries, Ltd., Osaka (JP); Nissan Chemical Industries, Ltd., Tokyo (JP)

( * ) Notice: Subject to any disclaimer, the term of this patent is extended or adjusted under 35 U.S.C. 154(b) by 103 days.

(21) Appl. No.: 12/376,334

(22) PCT Filed: Aug. 3, 2007

(86) PCT No.: PCT/JP2007/065296
§ 371 (c)(1),
(2), (4) Date: Mar. 13, 2009

(87) PCT Pub. No.: WO2008/018392
PCT Pub. Date: Feb. 14, 2008

(65) Prior Publication Data
US 2010/0003791 A1    Jan. 7, 2010

(30) Foreign Application Priority Data

Aug. 7, 2006 (JP) .............................. P 2006-214809

(51) Int. Cl.
*H01L 21/00* (2006.01)
(52) U.S. Cl. .................... 438/781; 438/780; 257/643
(58) Field of Classification Search .................. 438/780, 438/781; 257/643
See application file for complete search history.

(56) References Cited

U.S. PATENT DOCUMENTS 6,927,012 B2 * 8/2005 Hatanaka et al. .......... 430/270.1
(Continued)

FOREIGN PATENT DOCUMENTS

CN          1264271 A       8/2000
(Continued)

OTHER PUBLICATIONS

Ebisawa, F., et al., "Electrical properties of polyacetylene/polysiloxane interface", J. Appl. Phys., Jun. 1983, pp. 3255-3259, vol. 54 No. 6, American Institute of Physics.

(Continued)

*Primary Examiner* — Jarrett J Stark
*Assistant Examiner* — Nicholas Tobergte
(74) *Attorney, Agent, or Firm* — McDermott Will & Emery LLP

(57) ABSTRACT

An object of the present invention is to provide a method for manufacturing an electronic circuit component such as an organic TFT 1, which can manufacture an electronic circuit component excellent in reliability and having quality on a practical level, because an insulating layer and a conductive layer which have more excellent characteristics can be formed, particularly, on a general-purpose plastic substrate or the like by treatment at a process temperature of 200° C. or lower which has no influence on the above-mentioned plastic substrate.

The method for manufacturing an electronic circuit component according to the invention includes heating a layer containing at least one of a polyimide and a precursor thereof at a temperature of 200° C. or lower to form an insulating layer 4 having a contact angle with water of 80° or more, forming a coating film including a dispersion containing metal nanoparticles on the above-mentioned insulating layer 4 and heating the above-mentioned coating film at a temperature of 200° C. or lower to form a conductive layer such as a source layer 5 or a drain layer 6.

4 Claims, 1 Drawing Sheet

U.S. PATENT DOCUMENTS

| | | | |
|---|---|---|---|
| 7,217,754 B2 * | 5/2007 | Koloski et al. | 524/430 |
| 7,306,969 B2 * | 12/2007 | Wu et al. | 438/99 |
| 7,718,707 B2 * | 5/2010 | Kelman et al. | 516/1 |
| 2003/0092214 A1 * | 5/2003 | Klauk et al. | 438/99 |
| 2005/0129843 A1 | 6/2005 | Wu et al. | |
| 2005/0276912 A1 | 12/2005 | Yamamoto et al. | |
| 2006/0060885 A1 | 3/2006 | Wu et al. | |
| 2007/0069210 A1 * | 3/2007 | Yamazaki et al. | 257/59 |

FOREIGN PATENT DOCUMENTS

| | | |
|---|---|---|
| CN | 1741298 A | 3/2006 |
| CN | 1805652 A | 7/2006 |
| EP | 1 541 524 A2 | 6/2005 |
| JP | 62-085467 | 4/1987 |
| JP | 04-133351 | 5/1992 |
| JP | 08-191162 | 7/1996 |
| JP | 3006718 | 11/1999 |
| JP | 2001-505002 | 4/2001 |
| JP | 2004-296424 | 10/2004 |
| JP | 2005-175472 | 6/2005 |
| JP | 2005-223049 | 8/2005 |
| JP | 2005-353728 | 12/2005 |
| JP | 2006-032916 | 2/2006 |
| WO | WO 99/10939 | 3/1999 |

OTHER PUBLICATIONS

Chinese Office Action, w/ English translation thereof, issued in Chinese Patent Application No. CN 200780029550.4 dated Jan. 8, 2010.

* cited by examiner

METHOD FOR MANUFACTURING ELECTRONIC CIRCUIT COMPONENT

RELATED APPLICATIONS

This application is the U.S. National Phase under 35 U.S.C. §371 of International Application No. PCT/JP2007/065296, filed on Aug. 3, 2007, which in turn claims the benefit of Japanese Application No. 2006-214809, filed on Aug. 7, 2006, the disclosures of which Applications are incorporated by reference herein.

TECHNICAL FIELD

The present invention relates to a novel method for manufacturing an electronic circuit component for manufacturing an electronic circuit component such as an organic electronic device or a wiring substrate in which a conductive layer functioning as an electrode, a conductor circuit or the like is formed on an insulating layer, by a low-temperature process of 200° C. or lower.

RELATED ART

In recent years, in order to put flexible displays such as so-called electronic paper and the like using flexible substrates such as plastic substrates to practical use, for field-effect transistors (FETs) and thin-film transistors (TFTs) formed on the above-mentioned displays as electronic devices which separately activate pixels of the displays, research and development for enabling formation by a process at a temperature as low as possible have been conducted, in order to prevent deterioration of the above-mentioned plastic substrates and the like. Of them, it has been proposed to also use a low-temperature polysilicon TFT process which has currently been in heavy usage in organic electronic devices other than the flexible displays.

However, even when the above-mentioned process is used, in order to manufacture TFTs having quality on a practical level, a process temperature of at least 250° C. is necessary, high heat resistance withstanding the above-mentioned process temperature is required for the flexible substrates. Accordingly, when the organic electronic devices are formed by the above-mentioned low-temperature polysilicon TFT process, general-purpose plastic substrates which are inexpensive and have low softening temperature, for example, a polycarbonate (PC), polyethylene terephthalate (PET) and the like, cannot be used as the flexible substrates. This causes an increase in cost of the flexible displays to disturb practical use.

Then, attention has been focused on organic TFTs which are simpler, high in workability and productivity, and moreover, possible to be formed at low temperatures, and have a high possibility to be also formed on the above-mentioned general—purpose plastic substrates, because they do not require a process using a vacuum apparatus (a vacuum deposition process, a sputtering process) which is frequently used in an ordinary TFT process such as the above-mentioned low-temperature polysilicon TFT process, and can be formed only by a process of coating or printing. FIG. 1 is a cross-sectional view showing a layer constitution of an example of the organic TFTs. Referring to FIG. 1, an organic TFT 1 of this example includes a gate electrode 3 formed on a substrate 2 such as a flexible substrate, an insulating layer 4 which covers the above—mentioned gate electrode 3, a source electrode 5 and a drain electrode 6 formed apart from each other on the above-mentioned insulating layer 4, and a semiconductor layer 7 which fills a region between the source electrode 5 and the drain electrode 6 on the above-mentioned insulating layer 4.

In the organic TNT 1 of the example of FIG. 1, the gate electrode 3, the source electrode 5 and the drain electrode 6 are generally formed by printing a fine metal particle—containing dispersion (such as a conductive paste) on the substrate 2 or the insulating layer 4, and drying it, followed by heating. Further, the insulating layer is formed by printing a dispersion containing fine inorganic particles such as silicon oxide ($SiO_2$), aluminum oxide ($Al_2O_3$) or tantalum oxide ($Ta_2O_5$) or a precursor thereof, on the substrate 2 on which the gate electrode 3 has been formed, and drying it, followed by heating.

Further, the semiconductor layer 7 is generally formed by applying a coating solution containing an arbitrary organic semiconductor material on the insulating layer 4 on which the source electrode 5 and the drain electrode 6 have been formed, so as to fill between the above-mentioned both electrodes, and drying it, followed by heating as needed. As the organic semiconductor materials for forming the semiconductor layer 7, there are usable, for example, various low-molecular compounds and polymer compounds containing a π electron conjugated system in their molecule. Specific examples of the organic semiconductor materials include, for example, pentacene and a thiophene oligomer derivative as the low-molecular compounds, and a five-membered heterocyclic ring-containing π-conjugated system polymer compound, polyethylenevinylene, polyacetylene and the like as the high molecular compounds (patent documents 1 to 4 and non-patent document 1).

Patent Document 1: Publication of Japanese Patent Application: Japanese Patent No. 3,006,718
Patent Document 2: Publication of Japanese Patent Application: JP-A-8-191162
Patent Document 3: Publication of Japanese Patent Application: JP-A-62-85467
Patent Document 4: Publication of Japanese Patent Application: JP-T-2001-505002 (the term "JP-T" as used herein means a published Japanese translation of a PCT patent application)
Non-Patent Document 1: "Electrical properties of polyacetylene/polysiloxane interface", F. Ebisawa et al., J. Appl. Phys., Vol. 54, No. 6, June 1983

DISCLOSURE OF THE INVENTION

Problems to be Solved by the Invention

When the various organic semiconductor materials previously described are used, it is possible to form semiconductor layers having quality on a practical level. However, under the present circumstances, the above-mentioned conventional organic TFTs do not become to have quality on a practical level, particularly when formed on the general—purpose plastic substrates of PC, PE or the like. Causes for this include that when the above-mentioned insulating layer or electrode is formed on the general-purpose plastic substrate, the heating temperature thereof is restricted by the heat resistant temperature of the above-mentioned plastic substrate, so that characteristics of the insulating layer or electrode can not be sufficiently improved.

For example, it is surely possible to form the insulating layer previously described, which is formed by using the dispersion of the fine inorganic particles or the precursor thereof, even when heating is conducted at a temperature lower than 250° C., the practical lower limit of the process temperature of the low-temperature polysilicon TFT process.

However, taking into account the formation of the insulating layer having sufficient insulation properties and excellent in adhesion to the substrate, and the formation of the conductive layer excellent in conductivity and moreover excellent in adhesion to the above-mentioned insulating layer, on the insulating layer formed, it is desirable to conduct heating at a temperature as high as possible even within the above-mentioned range.

However, in the case of the formation on the general-purpose plastic substrate, the heating temperature thereof is restricted by the heat resistant temperature of the above-mentioned plastic substrate, so that heating becomes insufficient, resulting in failure to form the insulating layer excellent in the above-mentioned respective characteristics in some cases. Further, it is also one of causes of failure to form the insulating layer excellent in the respective characteristics that the insulating layer including the fine inorganic particles and the plastic substrate are materials completely heterogeneous to each other, chemically or in characteristics such as the coefficient of thermal expansion, which causes original low adhesion between both.

The conductive layer such as the electrode is also the same. That is to say, taking into account the formation of the conductive layer having sufficient conductivity and also excellent in adhesion to the insulating layer, the heating temperature is preferably as high as possible even within the range of 250° C. or lower. However, in the case of the formation on the general-purpose plastic substrate, the above-mentioned heating temperature is restricted by the heat resistant temperature of the plastic substrate, so that heating becomes insufficient, resulting in failure to form the conductive layer excellent in the above-mentioned respective characteristics in some cases.

An object of the invention is to provide a method for manufacturing an electronic circuit component, which can manufacture an electronic circuit component excellent in reliability and having quality on a practical level, because an insulating layer and a conductive layer which have more excellent characteristics can be formed, particularly, on a general-purpose plastic substrate or the like by treatment at a process temperature of 200° C. or lower which has no influence on the above-mentioned plastic substrate.

Means for Solving the Problems

In order to solve the above-mentioned problems, the inventors have first studied to form an insulating layer by a resin which is organic matter homogeneous to a plastic substrate, chemically or in characteristics such as the coefficient of thermal expansion, and can form an insulating layer excellent in adhesion to the above-mentioned plastic substrate. Then, as a result of studies of various resins having insulation properties, the inventors have found out that it is suitable to form the insulating layer by applying on the plastic substrate a varnish in which at least one of a polyimide and a precursor thereof is dissolved in any solvent, and then, heating it at a temperature of 200° C. or lower, particularly, because the insulating layer excellent in insulating properties, adhesion to the plastic substrate, heat resistance, mechanical strength and the like can be formed without having an influence on the general-purpose plastic substrate and the like.

Then, for a conductive layer such as an electrode, which is formed on the above-mentioned insulating layer, the inventors have studied to decrease the temperature at which it can be heated, as low as possible. Then, the inventors have found out that when metal nanoparticles having a primary particle size on a nanometer level are used as fine metal particles which become a raw material for the conductive layer, the melting temperature of the above-mentioned metal nanoparticles can be decreased lower than the melting point of the original metal by the so-called Kubo effect, so that a large number of particles are sintered well, whereby it becomes possible to decrease the temperature at which the uniform conductive layer can be formed to 200° C. or lower, and therefore that the conductive layer having high conductivity compared to a conventional one can be formed by heating at the above-mentioned temperature of 200° C. or lower.

Further, the inventors have studied improvement in adhesion between the insulating layer including the above-mentioned polyimide and the conductive layer including the metal nanoparticles. As a result, the inventors have found out that when the contact angle of the insulating layer which is an index of wettability to water is 80° or more, adhesion of the conductive layer to the insulating layer can be improved.

Accordingly, the first invention is a method for manufacturing an electronic circuit component including the steps of heating a layer containing at least one of a polyimide and a precursor thereof at a temperature of 200° C. or lower to form an insulating layer having a contact angle with water of 80° or more, and forming a coating film including a dispersion containing metal nanoparticles on the above-mentioned insulating layer and heating the above-mentioned coating film at a temperature of 200° C. or lower to form a conductive layer.

Further, the inventors have also studied respective components constituting the dispersion which becomes a raw material for the conductive layer. As a result, the inventors have found out that the use of metal nanoparticles having a primary particle size of 100 nm or less sinters well a large number of particles by the Kubo effect previously described to be able to further improve the effect of forming the uniform conductive layer, and that the use of ones including at least one metal selected from the group consisting of Ag, Au, Pt, Pd, Ru, Ir, Sn, Cu, Ni, Fe, Co, Ti and In as the above-mentioned metal nanoparticles can further improve conductivity of the conductive layer formed.

Furthermore, it is also found out that when the dispersion is a so-called aqueous dispersion containing metal nanoparticles, a dispersant acting so as to uniformly disperse in water, and water as a solvent, environmental effects can be reduced, because an organic solvent is scarcely used. Accordingly, the second invention is the method for manufacturing an electronic circuit component of the first invention, wherein the conductive layer is formed by using a dispersion containing metal nanoparticles having a primary particle size of 100 nm or less and including at least one metal selected from the group consisting of Ag, Au, Pt, Pd, Ru, Ir, Sn, Cu, Ni, Fe, Co, Ti and In, a dispersant and water as a solvent.

As previously described, the method for manufacturing an electronic circuit component of the invention can be preferably applied to the manufacturing of organic electronic devices such as organic TFTs. That is to say, the third invention is the manufacturing method of the first or second invention, wherein the electronic circuit component is an organic electronic device including a gate electrode formed on a substrate, an insulating layer which covers the above—mentioned gate electrode, a source electrode and a drain electrode formed apart from each other on the above-mentioned insulating layer, and a semiconductor layer which fills a region between the source electrode and the drain electrode on the above-mentioned insulating layer, the layer containing at least one of the polyimide and the precursor thereof is formed on the above-mentioned substrate so as to cover the gate electrode and heated at a temperature of 200° C. or lower to form the insulating layer, thereafter, the coating film including the dispersion containing the metal nanoparticles is pattern-formed on the above-mentioned insulating layer, and the above-mentioned coating film is heated at a temperature of 200° C. or lower to form the source electrode and drain electrode including the conductive layer.

Further, the method for manufacturing an electronic circuit component of the invention can be preferably applied to the manufacturing of a wiring substrate such as a multilayer wiring substrate. That is to say, the fourth invention is the manufacturing method of the first or second invention, wherein the electronic circuit component is a wiring substrate in which a conductor circuit is formed on the insulating layer, the layer containing at least one of the polyimide and the precursor thereof is formed and heated at a temperature of 200° C. or lower to form the insulating layer, thereafter, the coating film including the dispersion containing the metal nanoparticles is pattern-formed on the above-mentioned insulating layer, and the above-mentioned coating film is heated at a temperature of 200° C. or lower to form the conductor circuit including the conductive layer.

Advantages of the Invention

According to the invention, it becomes possible to provide a method for manufacturing an electronic circuit component, which can manufacture an electronic circuit component excellent in reliability and having quality on a practical level, because an insulating layer and a conductive layer which have more excellent characteristics can be formed on a general-purpose plastic substrate or the like by treatment at a process temperature of 200° C. or lower which has no influence on the above-mentioned plastic substrate.

DESCRIPTION OF REFERENCE NUMERALS AND SIGNS

Figure 1:
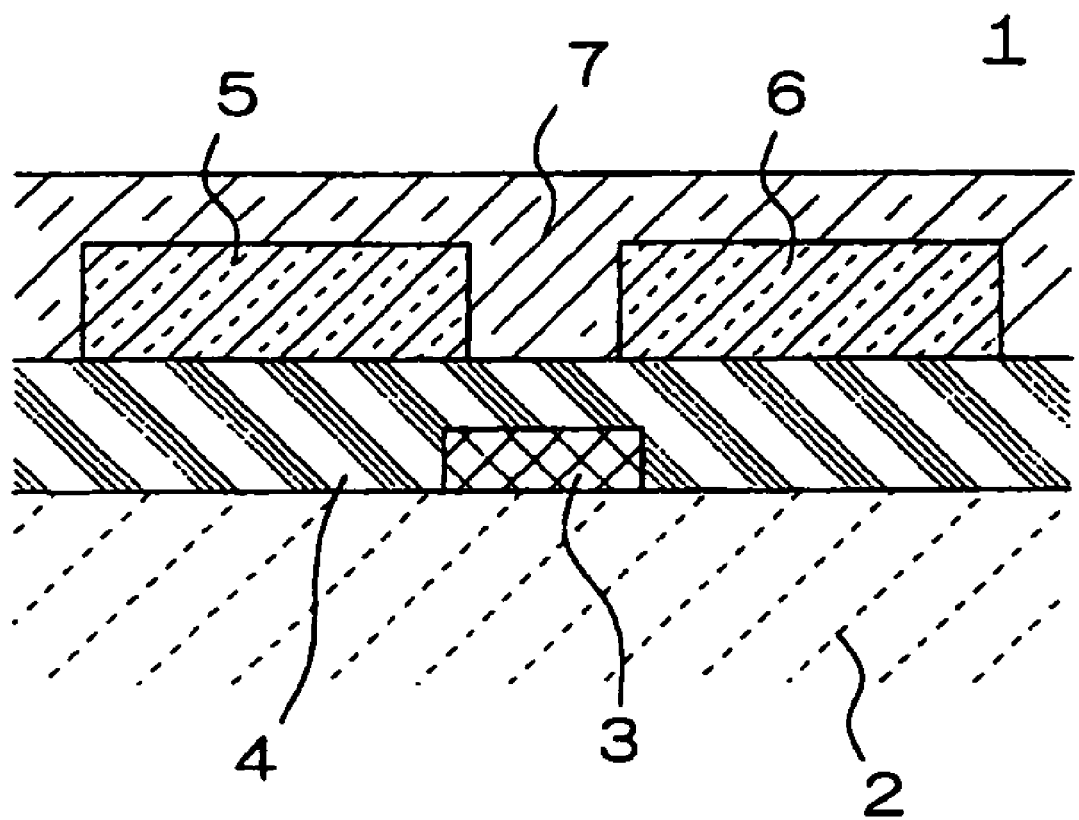
FIG. 1 is a cross-sectional view showing a layer constitution of an example of an organic TFT as an organic electronic device, which is manufactured by a method for manufacturing an electronic circuit component of the invention.

1 Organic TFT (Electronic Circuit Component), 2 Substrate, 3 Gate Electrode, 4 Insulating Layer, 5 Source Electrode (Conductive Layer), 6 Drain Electrode (Conductive Layer), 7 Semiconductor Layer

BEST MODE FOR CARRYING OUT THE INVENTION

The method for manufacturing an electronic circuit component of the invention is characterized by that it includes the steps of heating a layer containing at least one of a polyimide and a precursor thereof (hereinafter referred to as a polyimide-based compound in some cases) at a temperature of 200° C. or lower to form an insulating layer having a contact angle with water of 80° or more, and forming a coating film including a dispersion containing metal nanoparticles on the above-mentioned insulating layer and heating the above-mentioned coating film at a temperature of 200° C. or lower to form a conductive layer.

As the polyimide-based compound for forming the insulating layer, there can be used one or two or more kinds of various polyimides and precursors thereof which have at least one of repeating units represented by formula (1) and formula (2) in their molecule and can be film-formed by heating at a temperature of 200° C. or lower.

[CHEM. 1]

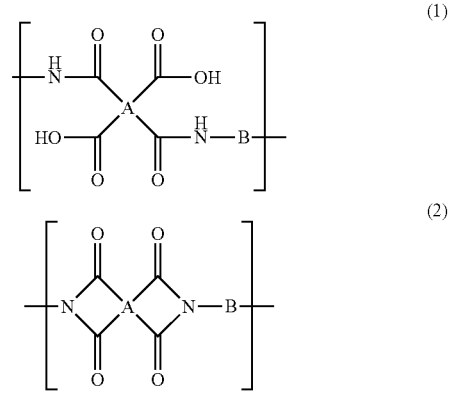

(in both formulas, A represents a tetravalent organic group, and B represents a divalent organic group.)

Specifically, from the various polyimide-based compounds from a polyamide acid whose repeating units are the repeating units represented by formula (1) in nearly the entire amount to a polyimide whose repeating units are the repeating units represented by formula (2) in nearly the entire amount, compounds which can form insulating layers excellent in insulating properties by film formation at a temperature of 200° C. or lower as previously described can be used either alone or as a combination of two or more thereof. Incidentally, the polyimide forming the insulating layer may contain an unreacted polyamide acid, or an unreacted polyamide acid moiety may be contained in a molecule of the polyimide, after film formation, within the range not impairing insulating properties, as well known. The case hereinafter described "the insulating layer including the polyimide is also the same. The above-mentioned polyimide compound can be synthesized, for example, although not limited thereto, by polymerization reaction of a group A-containing tetracarboxylic acid or an anhydride (such as a dianhydride) thereof and a group B-containing diamine compound, in a conventional manner.

Further, as the above-mentioned polyimide-based compound, it is necessary to use one in which the contact angle, an index of wettability to water, of the insulating layer film-formed by heating at a temperature of 200° C. or less is 80° or more. By making the contact angle of the insulating layer within the above-mentioned range, adhesion of the conductive layer to the above-mentioned insulating layer can be improved. Incidentally, taking further improvement of the above-mentioned effect into account, it is particularly preferred to use one in which the above-mentioned contact angle with water is from 90 to 100°, even within the above-mentioned range, as the polyimide-based compound.

The polyimide-based compounds satisfying the above-mentioned conditions include a polyimide-based compound in which A in formula (1) and formula (2) is a group represented by formula (3):

[CHEM. 3]

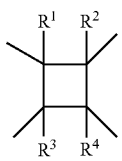

(3)

(wherein $R^1$ to $R^4$, which may be the same or different, each represents a hydrogen atom, a fluorine atom or a monovalent organic group having 1 to 4 carbon atoms), 10 to 100 mol % of B is a group represented by formula (4):

[CHEM. 4]

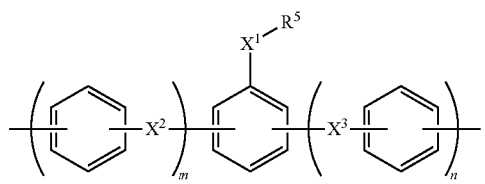

(4)

(wherein $X^1$ to $X^3$, which may be the same or different, each represents an —O— group, a —CO—O— group, a —CO—S— group, a —CO—NH— group, an alkylene group having 1 to 5 carbon atoms, which may be straight-chain or have a branched structure, or an alkylenedioxo group having 1 to 5 carbon atoms, which may be straight-chain or have a branched structure, further, $X^1$ to $X^3$ can also represent a single bond, that is to say, elements on both sides of $X^1$ to $X^3$ may be directly bonded to each other, $R^5$ represents an alkyl group having 6 or more carbon atoms or a fluorine-containing alkyl group having 6 or more carbon atoms, and m and n, which may be the same or different, each represents 0 or 1), and the remainder of B is a group free from an —$X^1$—$R^5$ group in formula (4).

In the above-mentioned polyimide-based compound, the contact angle, the index of wettability to water, of the insulating layer can be arbitrarily adjusted within the above-mentioned range of 80° or more by adjusting the proportion of the groups of formula (4) in B, the carbon number of the alkyl group of $R^5$, the number of fluorine atoms in the fluorine-containing alkyl group of $R^5$ and the like. The proportion of the groups of formula (4) is preferably 20 mol % or more, above all, 50 mol % or more, and particularly from 70 to 100 mol %, even within the above-mentioned range. Further, the carbon numbers of the alkyl group of $R^5$ and the fluorine-containing alkyl group of $R^5$ are preferably from 10 to 30, and particularly from 15 to 20, even within the above-mentioned range. Specific compounds of the above-mentioned preferred polyimide-based compounds include, for example, a polyimide—based compound containing at least one of the repeating units of formulas (1) and (2), that is to say, in which the proportion of the repeating units of formula (1) is from 0 to 100%, $R^1$ to $R^4$ in formula (3) are all hydrogen atoms, 100 mol % of B is the group of formula (4), $X^1$ in formula (4) is an —O— group, $R^5$ is an alkyl group having 18 carbon atoms, and m and n are each 0.

In the manufacturing method of the invention, for example, in order to form a layer containing the polyimide-based compound on a surface of the general-purpose plastic substrate or the like, what is necessary is just to apply a varnish in which the above-mentioned polyimide-based compound is dissolved in any organic solvent, on the above-mentioned surface by any method of a dip coat method, a spin coat method, a roll coat method, a spray coat method, a bar coat method, a die coat method, a slit coat method, a brush coating method and the like, or when the insulating layer is pattern-formed, to perform printing by any printing method such as a transferring printing method, an ink jet printing method or a screen printing method, followed by drying, in a conventional manner. As a drying method, drying may be performed by heating in the atmosphere, in an inert gas such as nitrogen, in vacuum or the like using a heating apparatus such as a hot plate or an oven, as well as natural drying. What is necessary for heat drying is just to conduct drying within the temperature range in which the organic solvent can be evaporated to dry the varnish. It is preferred that the temperature is usually 40° C. or higher, and lower than 150° C.

Then, in the invention, the above-mentioned layer is heated under any circumstances such as in the atmosphere, in an inert gas such as nitrogen or in vacuum to form the insulating layer. The heating temperature is required to be within the temperature range of 200° C. or lower which has no influence on the general-purpose plastic substrate and the like, and particularly, it is preferably from 150 to 180° C. Incidentally, the formation of the layer by drying of the varnish and the formation of the insulating layer by heating of the above-mentioned layer can also be continuously conducted under the same atmosphere using the same heating apparatus while changing the heating temperature gradually or continuously.

The thickness of the insulating layer formed through the above-mentioned respective steps can be set within any range depending on the kind of electronic circuit component to be manufactured. For example, when the electronic circuit component is the organic electronic device such as the organic TFT previously described and the insulating layer is an insulating layer which covers a gate electrode, the thickness thereof is preferably from 20 to 1,000 nm, above all, from 50 to 800 nm, and particularly from 100 to 500 nm. Further, when the electronic circuit component is a wiring substrate such as a multilayer wiring substrate and the insulating layer is an insulating layer for insulating between upper and lower conductor circuits laminated in a thickness direction, the thickness thereof is preferably from 0.1 to 5.0 μm, above all, from 0.3 to 3.0 μm, and particularly from 0.5 to 1.5 μm. What is necessary for adjusting the thickness of the insulating layer is just to adjust only the coating thickness of the layer of the varnish which becomes a raw material therefor.

Then, in the invention, a coating film including a metal nanoparticle-containing dispersion is formed on the above-mentioned insulating layer. As the metal nanoparticles, there can be used various kinds of particles including any metals and having a primary particle size on a nanometer level. Particularly, taking into account further improvement of the effect of sintering well a large number of particles by the Kubo effect previously described to form the uniform conductive layer, and further improvement of conductivity of the conductive layer formed thereby, the metal nanoparticles having a primary particle size of 100 nm or less and including at least one metal selected from the group consisting of Ag, Au, Pt, Pd, Ru, Ir, Sn, Cu, Ni, Fe, Co, Ti and In is preferably used. Incidentally, it is preferred that the primary particle size of the metal nanoparticles is practically 1 nm or more, even within the above-mentioned range. In the invention, the primary particle size shall be indicated by the 50% diameter (D50) of a particle distribution of the metal nanoparticles, which is measured by using a particle size distribution measuring device to which the laser Doppler method is applied.

The conductive layer may be formed by either any one alone or two or more of the above-mentioned various metals. When the conductive layer is formed by two or more metals, metal nanoparticles including an alloy of the above-mentioned two or more metals may be used, or two or more kinds of metal nanoparticles including individual metal elements or an alloy of partial metals of all metals forming the conductive layer may be used in combination, as the metal nanoparticles. When the conductive layer is required to have particularly high conductivity, it is preferred that the above-mentioned conductive layer is formed by Ag excellent in conductivity or an alloy containing the above-mentioned Ag at a ratio of 50 atomic percent or more. The metal nanoparticles for forming the above-mentioned conductive layer include Ag nanoparticles, nanoparticles of an alloy containing Ag at the above-mentioned ratio, a mixture of Ag nanoparticles or nanoparticles of an alloy thereof and metal nanoparticles including another metal or alloy which are mixed with each other so as to give an Ag ratio within the above-mentioned range, and the like.

Further, the other metals forming alloys with Ag include at least one metal selected from the group consisting of Au, Pt, Pd, Ru, Ir, Sn, Cu, Ni, Fe, Co, Ti and In. The above-mentioned metal has, when it forms the alloy with Ag, an effect of inhibiting that the metal nanoparticles grow in excess by heat at the time of heating to excessively increase the crystal grain size of the metal which forms the conductive layer, or to generate voids in the conductive layer, an effect of making the conductive layer difficult to be oxidized, an effect of inhibiting the occurrence of so-called migration of Ag, and the like.

The metal nanoparticles can be manufactured by a high-temperature treating method called an impregnation method or various conventionally known methods such as a liquid phase reduction method and a gas phase method. Of these, what is necessary for manufacturing the metal nanoparticles by the liquid phase reduction method is just, for example, to dissolve a water-soluble metal compound which becomes a raw material for an ion of the metal which forms the metal nanoparticles and a dispersant in water, and to add a reducing agent, followed by reduction reaction of the ion of the metal for a predetermined period of time, preferably under stirring. Further, what is necessary for manufacturing the nanoparticles of the alloy by the liquid phase reduction method is just to use together two or more kinds of water-soluble metal compounds which become raw materials for ions of at least two kinds of metals which form the above-mentioned alloy. The metal nanoparticles manufactured by the liquid phase reduction method are characterized by that the shape is spherical or granular and uniform, that the particle size distribution is sharp, and moreover, that the primary particle size is small.

The water-soluble metal compounds which become raw materials for the ions of the metals include, for example, silver (I) nitrate [$AgNO_3$], silver methanesulfonate [$CH_3SO_3Ag$] and the like, in the case of Ag, and tetrachloroauric (III) acid tetrahydrate [$HAuCl_4.4H_2O$] and the like, in the case of Au. In the case of Pt, they include dinitrodiamine platinum (II) (Pt ($NO_3$)$_2$/($NH_3$)$_2$), hexachloroplatinic (IV) acid hexahydrate ($H_2[PtCl_6].6H_2O$) and the like, and in the case of Pd, they include a nitric acid solution of palladium (II) nitrate [$Pd(NO_3)_2/H_2O$], a solution of palladium (II) chloride [$PdCl_2$] and the like.

In the case of Ru, they include ruthenium (III) nitrate [$Ru(NO_3)_3$] and the like, and in the case of Ir, they include iridium (III) chloride [$IrCl_3$] and the like. In the case of Sn, they include tin (IV) chloride pentahydrate [$SnCl_4.5H_2O$] and the like, and in the case of Cu, they include copper (II) nitrate [$Cu(NO_3)_2$], copper (II) sulfate pentahydrate [$CuSO_4.5H_2O$] and the like. In the case of Ni, they include nickel (II) chloride hexahydrate [$NiCl_2.6H_2O$], nickel (II) nitrate hexahydrate [$Ni(NO_3)_2.6H_2O$] and the like.

In the case of Fe, they include iron (III) nitrate hexahydrate, nonahydrate ($Fe(NO_3)_3.6H_2O$, $9H_2O$), iron (II) chloride tetrahydrate ($FeCl_2.4H_2O$), iron (II) sulfate heptahydrate ($FeSO_4.7H_2O$), acetylacetone iron (III) ($Fe[CH(COCH_3)_2]_3$) and the like. In the case of Co, they include cobalt (II) chloride hexahydrate [$CoCl_2.6H_2O$], cobalt (II) nitrate hexahydrate [Co ($NO_3$)$_3$.$6H_2O$] and the like, and in the case of Ti, they include titanium (III) chloride [$TiCl_3$] and the like. In the case of In, they include indium (III) chloride tetrahydrate [$InCl_3.4H_2O$], indium (III) nitrate trihydrate [$In(NO_3)_3$.$3H_2O$] and the like.

As the reducing agents, there can be all used various reducing agents which can reduce the ion of the metal in a liquid phase reaction system to precipitate it as the metal nanoparticles. The above-mentioned reducing agents include, for example, sodium borohydride, sodium hypophosphite, hydrazine and ions of transition metals (such as a trivalent titanium ion and a divalent cobalt ion). However, in order to make as small as possible the primary particle size of the metal nanoparticles precipitated, even within the range of 100 nm or less previously described, it is effective to decrease the reduction, precipitation rate of the ion of the metal, and in order to decrease the reduction, precipitation rate, it is preferred to selectively use the reducing agent having as weak reduction ability as possible.

The reducing agents having weak reduction ability include, for example, ethylene glycol, glutathione, organic acids (such as citric acid, malic acid and tartaric acid), reducing saccharides (such as glucose, galactose, mannose, fructose, sucrose, maltose, raffinose and stachyose), sugar alcohols (such as sorbitol) and the like, as well as alcohols such as methanol, ethanol and 2-propanol, and ascorbic acid. Above all, reducing saccharides and sugar alcohols as derivatives thereof are preferred.

As the dispersants, various dispersants are suitably used which have a molecular weight of 2,000 to 30,000, is solid at room temperature, moreover, have good solubility in water, and can disperse well the metal nanoparticles precipitated. The above-mentioned dispersant is present so as to surround the periphery of the metal nanoparticles precipitated in a reaction system to prevent coagulation of the metal nanoparticles, thereby acting to maintain dispersion. Further, the liquid phase reaction system in which the metal nanoparticles are precipitated can be used as a starting material for preparing the dispersion which contains the metal nanoparticles and becomes a raw material for the conductive layer, in a state where only impurities are removed without separating the metal nanoparticles from the above-mentioned reaction system. In that case, the above-mentioned dispersant is little removed in a process for removing impurities to remain, and prevents coagulation of the metal nanoparticles in the dispersion as previously described, thereby continuing to act to maintain dispersion.

Incidentally, when the molecular weight of the dispersant is less than 2,000, there is a fear of failing to sufficiently obtain the effect of preventing coagulation of the metal nanoparticles to maintain dispersion by the above-mentioned dispersant. Accordingly, the conductive layer formed by heating the dispersion containing the metal nanoparticles after applied to the surface of the insulating layer previously described can not be made smooth and dense in film properties and free from voids and the like in some cases. Further, there is a fear that the dispersant having a molecular weight exceeding 30,000 inhibits the metal nanoparticles from being sintered to one another to generate voids or to decrease denseness in film properties in the heating process at the time when the conductive layer is formed, because it is too large in bulk, and there is a fear that cracked residues of the dispersant remain in the conductive layer as impurities to decrease conductivity of the above-mentioned conductive layer.

Compared with this, the dispersant having a molecular weight of 2,000 to 30,000 not only is excellent in the function of dispersing well the metal nanoparticles in the dispersion, but also does not generate voids in the conductive layer after heating or does not decrease denseness in film properties, because it is not too large in bulk, and moreover, it does not cause the cracked residues responsible for decreasing conductivity thereof to remain in the above-mentioned conductive layer. Incidentally, it is preferred that the dispersant does not contains sulfur, phosphorus, boron and a halogen atom, taking into account that when the conductive layer is used in the field of electronics, such as the organic electronic devices such as the organic TFTs and the wiring substrates such as the multilayer wiring substrates, which are previously described, deterioration of the electronic components and the like which are disposed adjacent thereto is prevented.

The preferred dispersants satisfying these conditions include, for example, dispersants having a molecular weight ranging from 2,000 to 30,000, of amine-based polymer dispersants such as polyethyleneimine and polyvinylpyrrolidone, hydrocarbon-based polymer dispersants containing a carboxylic acid group in their molecule such as polyacrylic acid and carboxymethylcellulose, and polar group-containing polymer dispersants such as poval (polyvinyl alcohol) and a copolymer having a polyethyleneimine moiety and a polyethylene oxide moiety in one molecule. The dispersant can also be added to the reaction system in a solution state where it is dissolved in water or an organic solvent.

In order to adjust the primary particle size of the metal nanoparticles, what is necessary is just to adjust the kinds and compounding ratios of metal compound, dispersant and reducing agent, and to adjust the stirring rate, temperature, time, pH and the like when the reduction reaction of the metal compound is conducted. For example, the pH of the reaction system is preferably from 7 to 13, taking into account the formation of the metal nanoparticles having a primary particle size as small as possible. In order to adjust the pH of the reaction system to the above-mentioned range, a pH adjusting agent is used. The pH adjusting agent is preferably an alkali metal or an alkali earth metal, a halogen element such as chlorine, or nitric acid or ammonium free from impurities such as sulfur, phosphorus and boron, taking it into account to prevent deterioration of the conductive layer formed or electronic components and the like which are disposed adjacent thereto when the above-mentioned conductive layer is used in the field of electronics.

The metal nanoparticles precipitated in the liquid phase reaction system are once obtained in powder form through processes of separation by filtration, washing, drying, cracking and the like, and then, water and the dispersant, and further a water-soluble organic solvent as needed may be compounded at a predetermined ratio to prepare the dispersion which contains the metal nanoparticles and becomes the raw material for the coating film. However, as previously described, the above-mentioned dispersion is preferably prepared using as the starting material the liquid phase reaction system in which the metal nanoparticles are precipitated. That is to say, impurities are removed from the liquid phase reaction system containing the above-mentioned metal nanoparticles precipitated and water used in the reaction, by performing treatments such as ultrafiltration, centrifugation, water washing and electrodialysis, water is removed or conversely added to adjust the concentration of the metal nanoparticles as needed, and then, the water-soluble organic solvent is further incorporated at a predetermined ratio as needed, thereby preparing the dispersion containing the metal nanoparticles. According to this method, the occurrence of coarse and irregular particles due to coagulation of the metal nanoparticles is prevented, thereby being able to form the more dense and uniform conductive layer.

The ratio of water contained in the dispersion is preferably from 20 to 400 parts by weight per 100 parts by weight of the metal nanoparticles. When the ratio of water contained is less than the above-mentioned range, there is a fear of failing to sufficiently obtain the effect of sufficiently swelling the dispersant with water to disperse well the metal nanoparticles surrounded by the dispersant in the dispersion without the occurrence of coagulation. On the other hand, in the case of exceeding the above-mentioned range, there is a fear that the ratio of the metal nanoparticles contained in the dispersion decreases to fail to form the coating film having a sufficient thickness and density, and the conductive layer.

As the water-soluble organic solvents, various organic solvents having water solubility can be used. Specific examples thereof include alcohols such as methyl alcohol, ethyl alcohol, n-propyl alcohol, isopropyl alcohol, n-butyl alcohol, isobutyl alcohol, sec-butyl alcohol and tert-butyl alcohol, ketones such as acetone and methyl ethyl ketone, polyhydric alcohols such as ethylene glycol and glycerol or esters thereof, glycol ethers such as ethylene glycol monoethyl ether and diethylene glycol monobutyl ether, and the like.

The ratio of the water-soluble organic solvent contained is preferably from 30 to 900 parts by weight per 100 parts by weight of the metal nanoparticles. When the ratio of the water-soluble organic solvent contained is less than the above-mentioned range, there is a fear of failing to sufficiently obtain an effect of adjusting the viscosity and vapor pressure of the dispersion by allowing the above-mentioned organic solvent to be contained. On the other hand, in the case of exceeding the above-mentioned range, there is a fear that the excess organic solvent inhibits the effect of sufficiently swelling the dispersant with water to disperse well the metal nanoparticles surrounded by the dispersant in the dispersion without the occurrence of coagulation.

The ratio of the dispersant contained is preferably from 3 to 60 parts by weight per 100 parts by weight of the metal nanoparticles. When the ratio of the dispersant contained is less than the above-mentioned range, there is a fear of failing to sufficiently obtain the effect of being present so as to surround the periphery of the metal nanoparticles precipitated in the water-containing dispersion to prevent coagulation of the metal nanoparticles, by allowing the above-mentioned dispersant to be contained. On the other hand, in the case of exceeding the above-mentioned range, there is a fear that the excess dispersant inhibits sintering of the metal nanoparticles to generate voids or to decrease denseness in film properties in the heating process, and there is a fear that cracked residues of the polymer dispersant remain in the conductive layer as impurities to decrease conductivity of the conductive layer.

Coating methods for applying the dispersion to the surface of the insulating layer to form the coating film include a dip coat method, a spin coat method, a roll coat method, a spray coat method, a bar coat method, a die coat method, a slit coat method or a brush coating method. According to the above-mentioned methods, the dispersion can be uniformly applied to the surface of the insulating layer, so that the thickness of the conductive layer formed through the subsequent heating process can be made more uniform. In order to pattern-form the coating film formed by the above-mentioned methods into a predetermined planar shape, for example, etching utilizing a photolithograph method is suitably employed. According to the etching utilizing the photolithograph method, a fine pattern such as a source electrode or a drain electrode of an organic electronic device or a conductive circuit of a wiring substrate can be pattern-formed with a good degree of accuracy and moreover with good reproducibility.

For details, a resist layer sensitive to light is laminated on the coating film after dried, and the above-mentioned resist layer is exposed to light and developed to form a resist mask which covers a region of the coating film corresponding to the pattern to be formed. Then, the coating film exposed without being covered with the above-mentioned resist mask is selectively removed by etching, thereby pattern-forming the above-mentioned coating film into the predetermined planar shape. As methods for removing the coating film exposed without being covered with the resist mask by etching, there are a liquid phase method using an etching liquid and a gas phase method using an etching gas or an ion beam. In the invention, either of them may be used. However, when the substrate is the general-purpose plastic substrate previously described or the like, the liquid phase method is preferred, taking into account prevention of deterioration of the above-mentioned substrate. In order to form the conductive layer by heating the coating film pattern-formed, what is necessary is just to heat it at a temperature at which organic matter such as the dispersant contained in the above-mentioned coating film can be pyrolyzed and the metal nanoparticles contained therein can be sintered.

Heating may be performed in the air in order to pyrolyze the organic matter, or may be further performed in a non-oxidizing atmosphere or a reducing atmosphere after heating in the air in order to prevent oxidation of the metal nanoparticles. The temperature of heating is preferably 200° C. or lower, and particularly from 150 to 180° C., as previously described, in order to inhibit an excessive increase in the crystal grain size of the metal which forms the conductive layer formed by the above-mentioned heating, the occurrence of voids in the conductive layer, or deterioration of the plastic substrate. Further, the coating film is heated without performing pattern formation to form the conductive layer, and then, the above-mentioned conductive layer can also be pattern-formed by etching utilizing the photolithograph method, or the like. Furthermore, the dispersion is previously printed on the surface of the insulating layer into a predetermined pattern by any printing method such a transferring printing method, an ink jet printing method or a screen printing method, and then, heated, thereby also being able to obtain the pattern-formed conductive layer.

FIG. 1 is a cross-sectional view showing a layer constitution of an example of organic TFTs as organic electronic devices. Referring to FIG. 1, an organic TFT 1 of this exampleincludes a gate electrode 3 formed on a substrate 2, an insulating layer 4 which covers the above-mentioned gate electrode 3, a source electrode 5 and a drain electrode 6 formed apart from each other on the above-mentioned insulating layer 4, and a semiconductor layer 7 which fills a region between the source electrode 5 and the drain electrode 6 on the above-mentioned insulating layer 4. Of the above-mentioned organic TFTS, the insulating layer 4 and the source electrode 5 and drain electrode 6 thereon are manufactured by the manufacturing method of the invention.

That is to say, a layer containing the polyimide-based compound previously described is formed on the substrate 2 so as to cover the gate electrode 3 previously formed, and heated at a temperature of 200° C. or lower to form the insulating layer 4. The coating film including the dispersion containing the metal nanoparticles is pattern-formed on the above-mentioned insulating layer 4, and heated at a temperature of 200° C. or lower to form the source electrode 5 and drain electrode 6 including the conductive layer. The other portion constituting the organic TFT can be formed in a conventional manner.

For example, as the substrate 2, a flexible substrate such as a plastic substrate is used, when the organic TFT of the FIGURE is an electronic device which separately activates pixels of a flexible display such as electronic paper. In that case, according to the invention, the insulating layer 4, the source electrode 5 and the drain electrode 6 can be formed by the low-temperature process of 200° C. or lower, as previously described, so that a general-purpose plastic substrate low in softening temperature and inexpensive, such as PC or PET, can be used as the above-mentioned plastic substrate. This causes cost reduction, and the practical use of the flexible display such as the above-mentioned electronic paper can be promoted.

The gate electrode 3 may be formed either by a vacuum deposition process, a spattering process or the like, or by heating the coating film including the dispersion containing the metal nanoparticles, as is the case with the source electrode 5 and the drain electrode 6. In particular, according to the latter process, the organic TFT can be formed only by a process of coating or printing without requiring a process using a vacuum apparatus. Accordingly, for example, the cost of the flexible display can be further reduced. The heating temperature in heating the coating film is preferably 200° C. or lower, also taking into account prevention of deterioration of the genera-purpose plastic substrate. Further, the semiconductor layer 7 can be formed by applying the coating solution containing the organic semiconductor material previously described on the insulating layer 4 on which the source electrode 5 and the drain electrode 6 have been formed, so as to fill between the above-mentioned both electrodes, and drying it, followed by heating as needed.

The method for manufacturing an electronic circuit component of the invention is suitably employed as a method for manufacturing an organic electronic device or a wiring substrate, as previously described. The organic electronic devices which can be manufactured by the manufacturing method of the invention include organic field-effect transistors (FETs), organic electroluminescence (EL) devices, organic energy conversion elements, sensor elements and the like.

Further, the wiring substrates include monolayer or multi-layer substrates and the like.

EXAMPLES

Example 1

Synthesis of Polyimide-Based Compound

A tetracarboxylic acid dianhydride represented by formula (5):

[CHEM. 5]

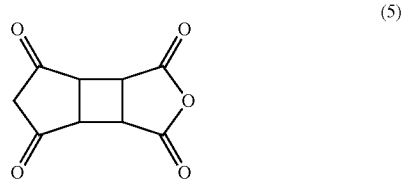

(5)

and a diamine compound represented by formula (6):

[CHEM. 6]

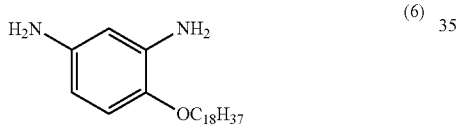

(6)

are polymerized to synthesize a polyimide-based compound including only repeating units of formula (1) previously described, wherein A in formula (1) is a group of formula (3) and $R^1$ to $R^4$ in formula (3) are all hydrogen atoms, and 100 mol % of B is a group of formula (4), $X^1$ in formula (4) is an —O-group, $R^5$ is an alkyl group having 18 carbon atoms and m and n are 0.

(Formation of Insulating Layer)

A varnish having a polyimide-based compound concentration of 6% by weight in which the polyimide-based compound previously synthesized is dissolved in N-methyl-2-pyrrolidone as an organic solvent is dropped on an ITO transparent conductive layer formed on one surface of a glass substrate (5.0 cm square, thickness: 0.7 mm) by using a syringe provided with a filter having a pore size of 0.2 μm to form a layer on the above-mentioned ITO film by a spin coat method. Thereafter, the layer is heated for 5 minutes using a hot plate heated at 80° C. in the air to dry it, and then, the temperature of the hot plate is raised to 200° C., followed by heating for 60 minutes to form an insulating layer. The thickness of the insulating layer is about 200 nm. The contact angle of the above-mentioned insulating layer with deionized water is measured under constant-temperature and constant-humidity circumstances of a temperature of 25±2° C. and a humidity of 50±5%, by using a dynamic contact angle meter [CA-W manufactured by Kyowa Interface Science Co., Ltd.], at a liquid amount of 3 μl, in a state where the deionized water is allowed to stand still for 5 seconds after landed on the insulating layer. As a result, it is 960.

(Formation of Conductive Layer)

A dispersion of Ag nanoparticles containing the Ag nanoparticles having a primary particle size of 20 nm, a mixed solvent of water and propylene glycol monomethyl ether as a solvent, and a carboxylic acid-based polymer dispersant (molecular weight: 15,000) is dropped on the insulating layer formed on the ITO film of the above-mentioned glass substrate by using a syringe provided with a filter having a pore size of 0.2 μm to form a coating film on the above-mentioned insulating layer by a spin coat method. After dried, the coating film is heated by using a hot plate under any one of the following conditions:

Conditions 1: 150° C., for 120 minutes
Conditions 2: 180° C., for 120 minutes
Conditions 3: 200° C., for 60 minutes

Comparative Example 1

A tetracarboxylic acid dianhydride represented by formula (7):

[CHEM. 7]

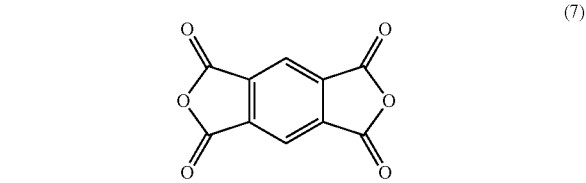

(7)

and a diamine compound represented by formula (8):

[CHEM. 8]

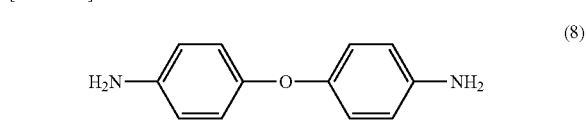

(8)

are polymerized to synthesize a polyimide-based compound. An insulating layer is formed in the same manner as in Example 1 with the exception that the polyimide-based compound thus obtained is used, and the contact angle thereof with deionized water is measured under the same conditions as in Example 1. As a result, it is 70°. Then, a conductive layer having a thickness of about 200 nm is formed on the above-mentioned insulating layer in the same manner as in Example 1.

Comparative Example 2

A Si wafer having a diameter of 4 inch (<110>, antimony dope, thickness: 525±25 μm, specific resistance: 0.02Ω·cm or less) is thermally oxidized to form a 200 nm thick insulating layer including $SiO_2$ on a surface thereof, and the contact angle thereof with deionized water is measured under the same conditions as in Example 1. As a result, it is 520. Then, a conductive layer having a thickness of about 200 nm is formed on the above-mentioned insulating layer in the same manner as in Example 1.

Comparative Example 3

Hexamethylsilazane (HMDS, manufactured by Aldrich K.K.) is dropped on a 200 nm thick insulating layer formed on a surface of a Si wafer in the same manner as in Comparative Example 2 to form a coating film on the above-mentioned insulating layer by a spin coat method. Drying is performed at 100° C. for 5 minutes by using a hot plate, followed by standing still at room temperature. Thereafter, rinsing with acetone is performed, and the above-mentioned insulating layer is subjected to hydrophobizing treatment. The contact angle thereof with deionized water is measured under the same conditions as in Example 1. As a result, it is 90°. Then, a conductive layer having a thickness of about 200 nm is formed on the above-mentioned insulating layer in the same manner as in Example 1.

<<Adhesion Test>>

In each of conductive layers formed in Example and Comparative examples, 6 cuts reaching the insulating layer are formed in each of length and breadth in a grid shape so as to cross at right angles with 1 mm spacing, using a cutter. A cellophane adhesive tape having a width of 24 mm (adhesive force: 2.94 N/10 mm or more) is adhered thereon, and rubbed with a rubber eraser from above thereof to completely adhere it. Then, after 1 to 2 minutes, the tape is instantaneously peeled off to an upward direction perpendicular to a surface direction of the conductive layer, holding one end of the tape. At that time, the state of the conductive layer cut into 25 pieces by the above-mentioned grid shape is observed, and the adhesion of the conductive layer is evaluated by the following criteria:

Open circle: All of the 25 pieces of the conductive layer remained without peeling. Good in adhesion.

Open triangle: 1 to 24 pieces of the conductive layer peeled off. Somewhat poor in adhesion.

Cross: All of the 25 pieces of the conductive layer peeled off. Poor in adhesion.

The results thereof are shown in Table 1.

From Table 1, it is revealed that in Comparative Example 1 in which the conductive layer is formed on the insulating layer including the polyimide-based compound, but having a contact angle with deionized water of 80° or less, the adhesion of the conductive layer is good only when the heating conditions of the conductive layer is conditions 1 (150° C., for 120 minutes), but that the adhesion of the conductive layer became poor under the other conditions. Further, it is revealed that in Comparative Examples 2 and 3 in which the inorganic insulating layer including $SiO_2$ is used as the insulating layer, the adhesion of the conductive layer became poor under all conditions, regardless of the contact angle of the above—mentioned insulating layer with deionized water. Compared with this, it is confirmed that in Example 1 in which the conductive layer is formed on the insulating layer including the polyimide-based compound and having a contact angle with deionized water of 80° or more, the adhesion of the conductive layer is good even when the heating conditions of the conductive layer is any one of the above-mentioned conditions 1 to 3.

Example 2 and Comparative Examples 4 to 6

Conductive layers are each formed on the surfaces of the insulating layers, respectively, in the same manners as in Example 1 and Comparative Examples 1 to 3, with the exception that as the dispersion of the Ag nanoparticles becoming the raw material of the conductive layer, one containing the Ag nanoparticles having a primary particle size of 20 nm, a mixed solvent of water, glycol ether and polyether as a solvent, and a carboxylic acid-based polymer dispersant (molecular weight: 15,000) is used, and the adhesion thereof is evaluated. The results thereof are shown in Table 2.

TABLE 1

|  |  | Example 1 | Comparative Example 1 | Comparative Example 2 | Comparative Example 3 |
| --- | --- | --- | --- | --- | --- |
| Insulating Layer | Kind | Polyimide | Polyimide | $SiO_2$ | HMDS-treated $SiO_2$ |
|  | Contact Angle | 96° | 70° | 52° | 90° |
| Adhesion | Heating Conditions 1 | ◯ | ◯ | X | X |
|  | Heating Conditions 2 | ◯ | X | X | X |
|  | Heating Conditions 3 | ◯ | X | X | X |

TABLE 2

|  |  | Example 2 | Comparative Example 4 | Comparative Example 5 | Comparative Example 6 |
|---|---|---|---|---|---|
| Insulating Layer | Kind | Polyimide | Polyimide | $SiO_2$ | HMDS-treated $SiO_2$ |
|  | Contact Angle | 96° | 70° | 52° | 90° |
| Adhesion | Heating Conditions 1 | ○ | ○ | X | X |
|  | Heating Conditions 2 | ○ | X | X | X |
|  | Heating Conditions 3 | ○ | X | X | X |

From Table 2, it is revealed that the same results are obtained even when the composition of the dispersion of the Ag nanoparticles is changed. That is to say, it is revealed that in Comparative Example 4 in which the conductive layer is formed on the insulating layer including the polyimide-based compound, but having a contact angle with deionized water of 80° or less, the adhesion of the conductive layer is good only when the heating conditions of the conductive layer is conditions 1 (150° C., for 120 minutes), but that the adhesion of the conductive layer became poor under the other conditions. Further, it is revealed that in Comparative Examples 5 and 6 in which the inorganic insulating layer including $SiO_2$ is used as the insulating layer, the adhesion of the conductive layer became poor under all conditions, regardless of the contact angle of the above-mentioned insulating layer with deionized water. Compared with this, it is confirmed that in Example 2 in which the conductive layer is formed on the insulating layer including the polyimide-based compound and having a contact angle with deionized water of 80° or more, the adhesion of the conductive layer is good even when the heating conditions of the conductive layer are any one of the above-mentioned conditions 1 to 3.

<<Measurement of Specific Resistance>>

For Examples 1 and 2 in which the adhesion of the conductive layers is good, specific resistance of the above-mentioned conductive layers is measured by using a specific resistance meter (Loresta GP, MCP-T610, manufactured by Dia Instruments Co., Ltd.). The results thereof are shown in Table 3.

TABLE 3

|  |  | Example 1 | Example 2 |
|---|---|---|---|
| Specific Resistance $\mu\Omega \cdot cm$ | Heating Conditions 1 | 30 | 35 |
|  | Heating Conditions 2 | 10 | 6 |
|  | Heating Conditions 3 | 6 | 5 |

From the table, it is confirmed that the conductive layers of Examples 1 and 2 are excellent in conductivity, because the specific resistance is low even when the heating conditions are any one of the above-mentioned conditions 1 to 3, as previously described.

Although the invention is described in detail with reference to specific embodiments, it will be apparent to one skilled in the art that various changes and modifications can be made without departing from the spirit and scope of the invention.

Incidentally, this application is based on Japanese Patent Application No. 2006-214809 filed on Aug. 7, 2006, the whole of which is incorporated herein by reference. Further, all references cited herein are incorporated herein by reference in their entirety.

The invention claimed is:

1. A method for manufacturing an electronic circuit component comprising the steps of:

heating a layer containing at least one of a polyimide and a precursor thereof at a temperature of 200° C. or lower to form an insulating layer having a contact angle with water of 80° or more, and forming a coating film comprising a dispersion containing metal nanoparticles on the insulating layer and heating the coating film at a temperature of 200° C. or lower to form a conductive layer, wherein said polyimide and the precursor thereof include at least one of repeating units represented by formula (1) and formula (2):

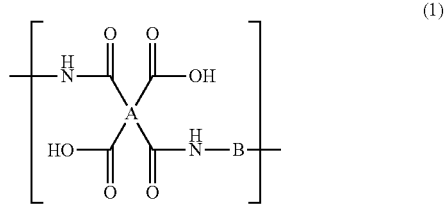

(1)

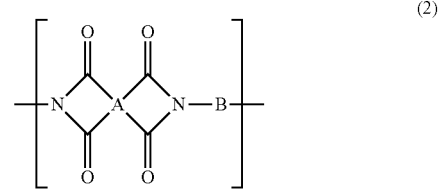

(2)

in which A in formula (1) and formula (2) is a tetravalent organic group represented by formula (3):

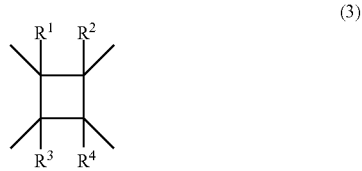

(3)

wherein $R^1$ to $R^4$, which is the same or different, each represents a hydrogen atom, a fluorine atom or a monovalent organic group having 1 to 4 carbon atoms, and B represents a divalent organic group, and 10 to 100 mol % of B is a group represented by formula (4):

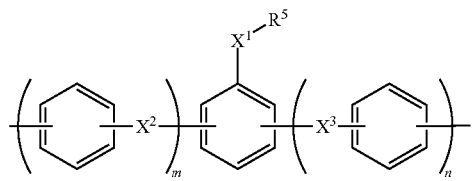

(4)

wherein $X^1$ to $X^3$, which may be the same or different, each represents an —O— group, a —CO—O— group, a —CO—S— group, a —CO—NH— group, an alkylene group having 1 to 5 carbon atoms, which has a straight-chain or a branched structure, or an alkylenedioxo group having 1 to 5 carbon atoms, which is a straight-chain or a branched structure, or a single bond, $R^5$ represents an alkyl group having 6 or more carbon atoms or a fluorine-containing alkyl group having 6 or more carbon atoms, and m and n, which is the same or different, each represents 0 or 1, and the remainder of B is a group free from an —X'—$R^5$ group in formula (4).

2. The method for manufacturing an electronic circuit component according to claim 1, wherein
the conductive layer is formed by using a dispersion containing metal nanoparticles having a primary particle size of 100 nm or less and comprising at least one metal selected from the group consisting of Ag, Au, Pt, Pd, Ru, Ir, Sn, Cu, Ni, Fe, Co, Ti and In, a dispersant and water as a solvent.

3. The method for manufacturing an electronic circuit component according to claim 1, wherein
the electronic circuit component is an organic electronic device comprising:
a gate electrode formed on a substrate,
an insulating layer which covers the gate electrode,
a source electrode and a drain electrode formed apart from each other on the insulating layer, and
a semiconductor layer which fills a region between the source electrode and the drain electrode on the insulating layer,
the insulating layer formed from the at least one of the polyimide and the precursor thereof is formed on the substrate so as to cover the gate electrode, thereafter,
during the formation of the coating film, the coating film comprising the dispersion containing the metal nanoparticles is pattern-formed on the insulating layer, and
the coating film forms the source electrode and drain electrode comprising the conductive layer.

4. The method for manufacturing an electronic circuit component according to claim 1, wherein
the electronic circuit component is a wiring substrate in which a conductor circuit is formed on the insulating layer,
and
during the formation of the coating film, the coating film comprising the dispersion containing the metal nanoparticles pattern-formed on the insulating layer forms the conductor circuit comprising the conductive layer.

* * * * *